(12) United States Patent
Harrison

(10) Patent No.: US 8,565,008 B2
(45) Date of Patent: *Oct. 22, 2013

(54) METHOD AND APPARATUS FOR GENERATING A SEQUENCE OF CLOCK SIGNALS

(75) Inventor: Ronnie M. Harrison, Boise, ID (US)

(73) Assignee: Round Rock Research, LLC, Jersey City, NJ (US)

( * ) Notice: Subject to any disclaimer, the term of this patent is extended or adjusted under 35 U.S.C. 154(b) by 448 days.

This patent is subject to a terminal disclaimer.

(21) Appl. No.: 13/021,223

(22) Filed: Feb. 4, 2011

(65) Prior Publication Data

US 2011/0122710 A1 May 26, 2011

Related U.S. Application Data

(63) Continuation of application No. 11/897,837, filed on Aug. 31, 2007, now Pat. No. 7,889,593, which is a continuation of application No. 11/182,965, filed on Jul. 15, 2005, now Pat. No. 7,415,404, which is a continuation of application No. 09/758,970, filed on Jan. 9, 2001, now Pat. No. 6,954,097, which is a continuation of application No. 08/879,847, filed on Jun. 20, 1997, now Pat. No. 6,173,432.

(51) Int. Cl.
*G11C 11/24* (2006.01)

(52) U.S. Cl.
USPC ..................... 365/149; 365/194; 365/233.1

(58) Field of Classification Search
None
See application file for complete search history.

(56) References Cited

U.S. PATENT DOCUMENTS 3,633,174 A 1/1972 Griffin
4,004,100 A 1/1977 Takimoto (Continued)

FOREIGN PATENT DOCUMENTS

EP 0 171 720 A2 2/1986
EP 0 295 515 A1 12/1988

(Continued)

OTHER PUBLICATIONS

Alvarez, J. et al. "A Wide-Bandwidth Low Voltage PLL for PowerPC. TM. Microprocessors" IEEE IEICE Trans. Electron., vol. E-78. No. 6, Jun. 1995, pp. 631-639.

(Continued)

*Primary Examiner* — Alexander Sofocleous
(74) *Attorney, Agent, or Firm* — Lerner, David, Littenberg, Krumholz & Mentlik, LLP

(57) ABSTRACT

A clock generator circuit generates a sequence of clock signals equally phased from each other from a master clock signal. The clock generator is formed by inner and outer delay-locked loops. The inner delay-locked loop includes a voltage controlled delay line that delays a reference clock applied to its input by a plurality of respective delays. Two of the clock signals in the sequence are applied to a phase detector so that the signals at the outputs of the delay line have predetermined phases relative to each other. The outer delay-locked loop is formed by a voltage controlled delay circuit that delays the command clock by a voltage controlled delay to provide the reference clock to the delay line of the inner delay-locked loop. The outer delay-locked loop also includes a phase detector that compares the command clock to one of the clock signals in the sequence generated by the delay line. The outer delay-locked loop thus locks one of the clock signals in the sequence to the command clock. As a result, all of the clock signals in the sequence generated by the delay line have respective predetermined phases relative to the phase of the command clock. One of the clock signals in the sequence is selected by a multiplexer to clock a command data latch at a time corresponding to the delay in coupling a command data bit to the latch.

22 Claims, 5 Drawing Sheets

(56) References Cited

U.S. PATENT DOCUMENTS

| | | | |
|---|---|---|---|
| 4,077,016 | A | 2/1978 | Sanders et al. |
| 4,096,402 | A | 6/1978 | Schroeder et al. |
| 4,404,474 | A | 9/1983 | Dingwall |
| 4,481,625 | A | 11/1984 | Roberts et al. |
| 4,508,983 | A | 4/1985 | Allgood et al. |
| 4,511,846 | A | 4/1985 | Nagy et al. |
| 4,514,647 | A | 4/1985 | Shoji |
| 4,524,448 | A | 6/1985 | Hullwegen |
| 4,573,017 | A | 2/1986 | Levine |
| 4,600,895 | A | 7/1986 | Landsman |
| 4,603,320 | A | 7/1986 | Farago |
| 4,638,187 | A | 1/1987 | Boler et al. |
| 4,638,451 | A | 1/1987 | Hester et al. |
| 4,687,951 | A | 8/1987 | McElroy |
| 4,697,167 | A | 9/1987 | O'Keeffe et al. |
| 4,727,541 | A | 2/1988 | Mori et al. |
| 4,740,962 | A | 4/1988 | Kish, III |
| 4,746,996 | A | 5/1988 | Furuhata et al. |
| 4,773,085 | A | 9/1988 | Cordell |
| 4,789,796 | A | 12/1988 | Foss |
| 4,791,594 | A | 12/1988 | Harney et al. |
| 4,791,622 | A | 12/1988 | Clay et al. |
| 4,818,995 | A | 4/1989 | Takahashi et al. |
| 4,893,087 | A | 1/1990 | Davis |
| 4,902,986 | A | 2/1990 | Lesmeister |
| 4,924,516 | A | 5/1990 | Bremer et al. |
| 4,953,128 | A | 8/1990 | Kawai et al. |
| 4,958,088 | A | 9/1990 | Farah-Bakhsh et al. |
| 4,970,609 | A | 11/1990 | Cunningham et al. |
| 4,972,470 | A | 11/1990 | Farago |
| 4,979,185 | A | 12/1990 | Bryans et al. |
| 4,984,204 | A | 1/1991 | Sato et al. |
| 4,984,255 | A | 1/1991 | Davis et al. |
| 5,020,023 | A | 5/1991 | Smith |
| 5,038,115 | A | 8/1991 | Myers et al. |
| 5,062,082 | A | 10/1991 | Choi |
| 5,075,569 | A | 12/1991 | Branson |
| 5,086,500 | A | 2/1992 | Greub |
| 5,087,828 | A | 2/1992 | Sato et al. |
| 5,113,519 | A | 5/1992 | Johnson et al. |
| 5,120,990 | A | 6/1992 | Koker |
| 5,122,690 | A | 6/1992 | Bianchi |
| 5,128,560 | A | 7/1992 | Chern et al. |
| 5,128,563 | A | 7/1992 | Hush et al. |
| 5,130,565 | A | 7/1992 | Girmay |
| 5,134,311 | A | 7/1992 | Biber et al. |
| 5,150,186 | A | 9/1992 | Pinney et al. |
| 5,165,046 | A | 11/1992 | Hesson |
| 5,168,199 | A | 12/1992 | Huffman et al. |
| 5,179,298 | A | 1/1993 | Hirano et al. |
| 5,182,524 | A | 1/1993 | Hopkins |
| 5,194,765 | A | 3/1993 | Dunlop et al. |
| 5,212,601 | A | 5/1993 | Wilson |
| 5,220,208 | A | 6/1993 | Schenck |
| 5,223,755 | A | 6/1993 | Richley |
| 5,229,929 | A | 7/1993 | Shimizu et al. |
| 5,233,314 | A | 8/1993 | McDermott et al. |
| 5,233,564 | A | 8/1993 | Ohshima et al. |
| 5,239,206 | A | 8/1993 | Yanai |
| 5,243,703 | A | 9/1993 | Farmwald et al. |
| 5,254,883 | A | 10/1993 | Horowitz et al. |
| 5,256,989 | A | 10/1993 | Parker et al. |
| 5,257,294 | A | 10/1993 | Pinto et al. |
| 5,258,936 | A | 11/1993 | Gallup et al. |
| 5,268,639 | A | 12/1993 | Gasbarro et al. |
| 5,272,729 | A | 12/1993 | Bechade et al. |
| 5,274,276 | A | 12/1993 | Casper et al. |
| 5,276,642 | A | 1/1994 | Lee |
| 5,278,460 | A | 1/1994 | Casper |
| 5,281,865 | A | 1/1994 | Yamashita et al. |
| 5,283,631 | A | 2/1994 | Koerner et al. |
| 5,289,580 | A | 2/1994 | Latif et al. |
| 5,295,164 | A | 3/1994 | Yamamura |
| 5,304,952 | A | 4/1994 | Quiet et al. |
| 5,311,481 | A | 5/1994 | Casper et al. |
| 5,311,483 | A | 5/1994 | Takasugi |
| 5,313,431 | A | 5/1994 | Uruma et al. |
| 5,315,269 | A | 5/1994 | Fujii |
| 5,315,388 | A | 5/1994 | Shen et al. |
| 5,321,368 | A | 6/1994 | Hoelzle |
| 5,327,365 | A | 7/1994 | Fujisaki et al. |
| 5,337,285 | A | 8/1994 | Ware et al. |
| 5,341,405 | A | 8/1994 | Mallard, Jr. |
| 5,347,177 | A | 9/1994 | Lipp |
| 5,347,179 | A | 9/1994 | Casper et al. |
| 5,355,391 | A | 10/1994 | Horowitz et al. |
| 5,361,002 | A | 11/1994 | Casper |
| 5,367,649 | A | 11/1994 | Cedar |
| 5,379,299 | A | 1/1995 | Schwartz |
| 5,383,143 | A | 1/1995 | Crouch et al. |
| 5,390,308 | A | 2/1995 | Ware et al. |
| 5,400,283 | A | 3/1995 | Raad |
| 5,402,389 | A | 3/1995 | Flannagan et al. |
| 5,408,640 | A | 4/1995 | MacIntyre et al. |
| 5,410,263 | A | 4/1995 | Waizman |
| 5,416,436 | A | 5/1995 | Rainard |
| 5,416,909 | A | 5/1995 | Long et al. |
| 5,420,544 | A | 5/1995 | Ishibashi |
| 5,424,687 | A | 6/1995 | Fukuda |
| 5,428,311 | A | 6/1995 | McClure |
| 5,428,317 | A | 6/1995 | Sanchez et al. |
| 5,430,408 | A | 7/1995 | Ovens et al. |
| 5,430,676 | A | 7/1995 | Ware et al. |
| 5,432,823 | A | 7/1995 | Gasbarro et al. |
| 5,438,545 | A | 8/1995 | Sim |
| 5,440,260 | A | 8/1995 | Hayashi et al. |
| 5,440,514 | A | 8/1995 | Flannagan et al. |
| 5,444,567 | A | 8/1995 | Kataoka |
| 5,444,667 | A | 8/1995 | Obara |
| 5,446,696 | A | 8/1995 | Ware et al. |
| 5,448,193 | A | 9/1995 | Baumert et al. |
| 5,451,898 | A | 9/1995 | Johnson |
| 5,457,407 | A | 10/1995 | Shu et al. |
| 5,463,337 | A | 10/1995 | Leonowich |
| 5,465,076 | A | 11/1995 | Yamauchi et al. |
| 5,473,274 | A | 12/1995 | Reilly et al. |
| 5,473,575 | A | 12/1995 | Farmwald et al. |
| 5,473,639 | A | 12/1995 | Lee et al. |
| 5,485,490 | A | 1/1996 | Leung et al. |
| 5,488,321 | A | 1/1996 | Johnson |
| 5,489,864 | A | 2/1996 | Ashuri |
| 5,497,127 | A | 3/1996 | Sauer |
| 5,497,355 | A | 3/1996 | Mills et al. |
| 5,498,990 | A | 3/1996 | Leung et al. |
| 5,500,808 | A | 3/1996 | Wang |
| 5,502,672 | A | 3/1996 | Kwon |
| 5,506,814 | A | 4/1996 | Hush et al. |
| 5,508,638 | A | 4/1996 | Cowles et al. |
| 5,513,327 | A | 4/1996 | Farmwald et al. |
| 5,515,403 | A | 5/1996 | Sloan et al. |
| 5,532,714 | A | 7/1996 | Knapp et al. |
| 5,539,345 | A | 7/1996 | Hawkins |
| 5,544,124 | A | 8/1996 | Zagar et al. |
| 5,544,203 | A | 8/1996 | Casasanta et al. |
| 5,550,515 | A | 8/1996 | Liang et al. |
| 5,550,549 | A | 8/1996 | Procter, Jr. et al. |
| 5,550,783 | A | 8/1996 | Stephens, Jr. et al. |
| 5,552,727 | A | 9/1996 | Nakao |
| 5,555,429 | A | 9/1996 | Parkinson et al. |
| 5,557,224 | A | 9/1996 | Wright et al. |
| 5,557,781 | A | 9/1996 | Stones et al. |
| 5,563,546 | A | 10/1996 | Tsukada |
| 5,568,075 | A | 10/1996 | Curran et al. |
| 5,568,077 | A | 10/1996 | Sato et al. |
| 5,572,557 | A | 11/1996 | Aoki |
| 5,572,722 | A | 11/1996 | Vogley |
| 5,574,698 | A | 11/1996 | Raad |
| 5,576,645 | A | 11/1996 | Farwell |
| 5,577,079 | A | 11/1996 | Zenno et al. |
| 5,577,236 | A | 11/1996 | Johnson et al. |
| 5,578,940 | A | 11/1996 | Dillon et al. |
| 5,578,941 | A | 11/1996 | Sher et al. |
| 5,579,326 | A | 11/1996 | McClure |
| 5,581,197 | A | 12/1996 | Motley et al. |

(56) References Cited

U.S. PATENT DOCUMENTS

| | | |
|---|---|---|
| 5,589,788 A | 12/1996 | Goto |
| 5,590,073 A | 12/1996 | Arakawa et al. |
| 5,594,690 A | 1/1997 | Rothenberger et al. |
| 5,610,558 A | 3/1997 | Mittel et al. |
| 5,614,855 A | 3/1997 | Lee et al. |
| 5,619,473 A | 4/1997 | Hotta |
| 5,621,340 A | 4/1997 | Lee et al. |
| 5,621,690 A | 4/1997 | Jungroth et al. |
| 5,621,739 A | 4/1997 | Sine et al. |
| 5,623,523 A | 4/1997 | Gehrke |
| 5,627,780 A | 5/1997 | Malhi |
| 5,627,791 A | 5/1997 | Wright et al. |
| 5,631,872 A | 5/1997 | Naritake et al. |
| 5,636,163 A | 6/1997 | Furutani et al. |
| 5,636,173 A | 6/1997 | Schaefer |
| 5,636,174 A | 6/1997 | Rao |
| 5,638,335 A | 6/1997 | Akiyama et al. |
| 5,644,605 A | 7/1997 | Whiteside |
| 5,644,743 A | 7/1997 | Barrett, Jr. et al. |
| 5,646,904 A | 7/1997 | Ohno et al. |
| 5,652,530 A | 7/1997 | Ashuri |
| 5,657,289 A | 8/1997 | Hush et al. |
| 5,657,481 A | 8/1997 | Farmwald et al. |
| 5,663,921 A | 9/1997 | Pascucci et al. |
| 5,666,313 A | 9/1997 | Ichiguchi |
| 5,666,322 A | 9/1997 | Conkle |
| 5,668,763 A | 9/1997 | Fujioka et al. |
| 5,668,774 A | 9/1997 | Furutani |
| 5,673,005 A | 9/1997 | Pricer |
| 5,675,274 A | 10/1997 | Kobayashi et al. |
| 5,675,588 A | 10/1997 | Maruyama et al. |
| 5,692,165 A | 11/1997 | Jeddeloh et al. |
| 5,694,065 A | 12/1997 | Hamasaki et al. |
| 5,708,611 A | 1/1998 | Iwamoto et al. |
| 5,712,580 A | 1/1998 | Baumgartner et al. |
| 5,712,883 A | 1/1998 | Miller et al. |
| 5,719,508 A | 2/1998 | Daly |
| 5,737,342 A | 4/1998 | Ziperovich |
| 5,740,123 A | 4/1998 | Uchida |
| 5,751,665 A | 5/1998 | Tanoi |
| 5,764,092 A | 6/1998 | Wada et al. |
| 5,767,715 A | 6/1998 | Marquis et al. |
| 5,768,177 A | 6/1998 | Sakuragi |
| 5,774,699 A | 6/1998 | Nagae |
| 5,778,214 A | 7/1998 | Taya et al. |
| 5,781,499 A | 7/1998 | Koshikawa |
| 5,784,422 A | 7/1998 | Heermann |
| 5,789,947 A | 8/1998 | Sato |
| 5,790,612 A | 8/1998 | Chengson et al. |
| 5,794,020 A | 8/1998 | Tanaka et al. |
| 5,805,931 A | 9/1998 | Morzano et al. |
| 5,812,619 A | 9/1998 | Runaldue |
| 5,822,314 A | 10/1998 | Chater-Lea |
| 5,831,545 A | 11/1998 | Murray et al. |
| 5,831,929 A | 11/1998 | Manning |
| 5,841,707 A | 11/1998 | Cline et al. |
| 5,852,378 A | 12/1998 | Keeth |
| 5,872,959 A | 2/1999 | Nguyen et al. |
| 5,889,828 A | 3/1999 | Miyashita et al. |
| 5,889,829 A | 3/1999 | Chiao et al. |
| 5,898,242 A | 4/1999 | Peterson |
| 5,898,674 A | 4/1999 | Mawhinney et al. |
| 5,909,130 A | 6/1999 | Martin et al. |
| 5,917,760 A | 6/1999 | Millar |
| 5,920,518 A | 7/1999 | Harrison et al. |
| 5,926,047 A | 7/1999 | Harrison |
| 5,926,436 A | 7/1999 | Toda et al. |
| 5,940,608 A | 8/1999 | Manning |
| 5,940,609 A | 8/1999 | Harrison |
| 5,945,855 A | 8/1999 | Momtaz |
| 5,946,244 A | 8/1999 | Manning |
| 5,953,284 A | 9/1999 | Baker et al. |
| 5,953,386 A | 9/1999 | Anderson |
| 5,964,884 A | 10/1999 | Partovi et al. |
| 5,990,719 A | 11/1999 | Dai et al. |
| 6,005,694 A | 12/1999 | Liu |
| 6,005,823 A | 12/1999 | Martin et al. |
| 6,011,732 A | 1/2000 | Harrison et al. |
| 6,011,822 A | 1/2000 | Dreyer |
| 6,016,282 A | 1/2000 | Keeth |
| 6,023,489 A | 2/2000 | Hatch |
| 6,026,050 A | 2/2000 | Baker et al. |
| 6,026,134 A | 2/2000 | Duffy et al. |
| 6,029,250 A | 2/2000 | Keeth |
| 6,038,219 A | 3/2000 | Mawhinney et al. |
| 6,067,592 A | 5/2000 | Farmwald et al. |
| 6,072,802 A | 6/2000 | Uhm et al. |
| 6,087,857 A | 7/2000 | Wang |
| 6,101,152 A | 8/2000 | Farmwald et al. |
| 6,101,197 A | 8/2000 | Keeth et al. |
| 6,105,157 A | 8/2000 | Miller |
| 6,115,318 A | 9/2000 | Keeth |
| 6,119,242 A | 9/2000 | Harrison |
| 6,125,157 A | 9/2000 | Donnelly et al. |
| 6,147,905 A | 11/2000 | Seino |
| 6,147,916 A | 11/2000 | Ogura |
| 6,150,889 A | 11/2000 | Gulliver et al. |
| 6,160,423 A | 12/2000 | Haq |
| 6,173,432 B1 | 1/2001 | Harrison |
| 6,253,360 B1 | 6/2001 | Yoshiba |
| 6,259,755 B1 | 7/2001 | O'Sullivan et al. |
| 6,262,921 B1 | 7/2001 | Manning |
| 6,269,451 B1 | 7/2001 | Mullarkey |
| 6,285,726 B1 | 9/2001 | Gaudet |
| 6,295,328 B1 | 9/2001 | Kim et al. |
| 6,298,450 B1 | 10/2001 | Liu et al. |
| 6,327,196 B1 | 12/2001 | Mullarkey |
| 6,338,127 B1 | 1/2002 | Manning |
| 6,378,079 B1 | 4/2002 | Mullarkey |
| 6,438,043 B2 | 8/2002 | Gans et al. |
| 6,442,644 B1 | 8/2002 | Gustavson et al. |
| 6,484,244 B1 | 11/2002 | Manning |
| 6,499,111 B2 | 12/2002 | Mullarkey |
| 6,580,531 B1 | 6/2003 | Swanson et al. |
| 6,665,222 B2 | 12/2003 | Wright et al. |
| 6,694,496 B2 | 2/2004 | Goslin et al. |
| 6,809,555 B1 | 10/2004 | Nguyen |
| 6,931,086 B2 | 8/2005 | Harrison |
| 6,952,462 B2 | 10/2005 | Harrison |
| 6,954,097 B2 | 10/2005 | Harrison |
| 7,415,404 B2 | 8/2008 | Harrison |
| 2008/0195908 A1 | 8/2008 | Manning |
| 2008/0301533 A1 | 12/2008 | Lee et al. |
| 2010/0007383 A1 | 1/2010 | Harrison |

FOREIGN PATENT DOCUMENTS

| | | |
|---|---|---|
| EP | 0 406 786 A1 | 1/1991 |
| EP | 0 450 871 A2 | 10/1991 |
| EP | 0 476 585 A2 | 3/1992 |
| EP | 0 655 741 A2 | 5/1995 |
| EP | 0 655 834 A1 | 5/1995 |
| EP | 0 680 049 A2 | 11/1995 |
| EP | 0 703 663 A1 | 3/1996 |
| EP | 0 704 848 A2 | 4/1996 |
| EP | 0 704 975 A1 | 4/1996 |
| EP | 0 767 538 A1 | 4/1997 |
| JP | 6-1237512 A | 10/1986 |
| JP | 2-112317 A | 4/1990 |
| JP | 4-135311 A | 5/1992 |
| JP | 5-136664 A | 6/1993 |
| JP | 5-282868 A | 10/1993 |
| JP | 0-7319577 A | 12/1995 |
| WO | 94/29871 A1 | 12/1994 |
| WO | 95/22200 A1 | 8/1995 |
| WO | 95/22206 A1 | 8/1995 |
| WO | 96/10866 A1 | 4/1996 |
| WO | 97/14289 A2 | 4/1997 |
| WO | 97/42557 A2 | 11/1997 |

(56) References Cited

OTHER PUBLICATIONS

Anonymous, "Draft Standard for a High-Speed Memory Interface (SyncLink)", Microprocessor and Microcomputer Standards Subcommittee of the IEEE Computer Society, Copyright 1996 by the Institute of Electrical and Electronics Engineers, Inc., New York,NY, pp. 1-56.
Anonymous, "Programmable Pulse Generator", IBM Technical Disclosure Bulletin, vol. 17, No. 12, May 1975, pp. 3553-3554.
Anonymous, "Pulse Combining Network", IBM Technical Disclosure Bulletin, vol. 32, No. 12, May 1990, pp. 149-151.
Anonymous, "Variable Delay Digital Circuit", IBM Technical Disclosure Bulletin, vol. 35, No. 4A, Sep. 1992, pp. 365-366.
Aviram, A. et al., "Obtaining High Speed Printing on Thermal Sensitive Special Paper With a Resistive Ribbon Print Head", IBM Technical Disclosure Bulletin, vol. 27, No. 5, Oct. 1984, pp. 3059-3060.
Bazes, M., "Two Novel Fully Complementary Self-Biased CMOS Differential Amplifiers", IEEE Journal of Solid-State Circuits, vol. 26, No. 2, Feb. 1991, pp. 165-168.
Chapman, J. et al., "A Low-Cost High-Performance CMOS Timing Vernier for ATE", IEEE International Test Conference, Paper 21.2, 1995, pp. 459-468.
Christiansen, J., "An Integrated High Resolution CMOS Timing Generator Based on an Array of Delay Locked Loops", IEEE Journal of Solid-State Circuits, vol. 31, No. 7, Jul. 1996, pp. 952-957.
Combes, M. et al., "A Portable Clock Multiplier Generator Using Digital CMOS Standard Cells", IEEE Journal of Solid-State Circuits, vol. 31, No. 7, Jul. 1996, pp. 958-965.
Donnelly, K. et al., "A 660 MB/s Interface Megacell Portable Circuit in 0.3 .mu.m-0.7 .mu.m CMOS ASIC", IEEE Journal of Solid-State Circuits, vol. 31, No. 12, Dec. 1996, pp. 1995-2001.
Goto, J. et al., "A PLL-Based Programmable Clock Generator with 50- to 350-MHz Oscillating Range for Video Signal Processors", IEICE Trans. Electron., vol. E77-C, No. 12, Dec. 1994, pp. 1951-1956.
Gustaysion, David B., et al., "IEEE Standard for Scalable Coherent Interface (SCI)," IEEE Computer Society, IEEE Std. 1596-1992, Aug. 2, 1993.
Hamamoto, T., "400-MHz Random Column Operating SDRAM Techniques with Self-Skew Compensation", IEEE Journal of Solid-State Circuits, vol. 33, No. 5, May 1998, pp. 770-778.
Kikuchi, S. et al., "A Gate-Array-Based 666Mhz VLSI Test System", IEEE International Test Conference, Paper 21.1, 1995, pp. 451-458.
Ko, U. et al., "A 30-ps Jitter, 3.6-.mu.s Locking, 3.3-Volt Digital PLL for CMOS Gate Arrays", IEEE Custom Integrated Circuits Conference, 1993, pp. 23.3.1-23.3.4.
Lee, T. et al., "A 2.5V Delay-Locked Loop for an 18Mb 500MB/s DRAM", IEEE International Solid-State Circuits Conference Digest of Technical Papers, Paper No. FA 18.6, 1994, pp. 300-301.
Lesmeister, G., "A Densely Integrated High Performance CMOS Tester", International Test Conference, Paper 16.2, 1991, pp. 426-429.
Ljuslin, C. et al., "An Integrated 16-channel CMOS Time to Digital Converter", IEEE Nuclear Science Symposium & Medical Imaging Conference Record, vol. 1, 1993, pp. 625-629.
Maneatis, J., "Low-Jitter Process-Independent DLL and PLL Based on Self-Biased Techniques", IEEE Journal of Solid-State Circuits, vol. 31, No. 11, Nov. 1996, pp. 1723-1732.
Nakamura, M. et al., "A 156 Mbps CMOS Clock Recovery Circuit for Burst-mode Transmission", Symposium on VLSI Circuits Digest of Technical Papers, 1996, pp. 122-123.
Saeki, T. et al., "A 2.5-ns Clock Access, 250-MHz, 256-Mb SDRAM with Synchronous Mirror Delay", IEEE Journal of Solid-State Circuits, vol. 31, No. 11, Nov. 1996, pp. 1656-1665.
Santos, D. et al., "A CMOS Delay Locked Loop and Sub-Nanosecond Time-to-Digital Converter Chip", IEEE Nuclear Science Symposium and Medical Imaging Conference Record, vol. 1, Oct. 1995, pp. 289-291.
Shirotori, T. et al., "PLL-based, Impedance Controlled Output Buffer", 1991 Symposium on VLSI Circuits Digest of Technical Papers, pp. 49-50.

Sidiropoulos, S. et al., "A CMOS 500 Mbps/pin synchronous point to point link interface", IEEE Symposium on VLSI Circuits Digest of Technical Papers, 1994, pp. 43-44.
Sidiropoulos, S. et al., "A Semi-Digital DLL with Unlimited Phase Shift Capability and 0.08-400MHz Operating Range," IEEE International Solid State Circuits Conference, Feb. 8, 1997, pp. 332-333.
Soyuer, M. et al., "A Fully Monolithic 1.25GHz CMOS Frequency Synthesizer", IEEE Symposium on VLSI Circuits Digest of Technical Papers, 1994, pp. 127-128.
Taguchi, M. et al., "A 40-ns 64-Mb DRAM with 64-b Parallel Data Bus Architecture", IEEE Journal of Solid-State Circuits, vol. 26, No. 11, Nov. 1991, pp. 1493-1497.
Tanoi, S. et al., "A 250-622 MHz Deskew and Jitter-Suppressed Clock Buffer Using a Frequency- and Delay-Locked Two-Loop Architecture", 1995 Symposium on VLSI Circuits Digest of Technical Papers, vol. 11, No. 2, pp. 85-86.
von Kaenel, V. et al., "A 320 MHz, 1.5 mW @ 1.35 V CMOS PLL for Microprocessor Clock Generation", IEEE Journal of Solid-State Circuits, vol. 31, No. 11, Nov. 1996, pp. 1715-1722.
Watson, R. et al., "Clock Buffer Chip with Absolute Delay Regulation Over Process and Environmental Variations", IEEE Custom Integrated Circuits Conference, 1992, pp. 25.2.1-25.2.5.
Yoshimura, T. et al. "A 622-Mb/s Bit/Frame Synchronizer for High-Speed Backplane Data Communication", IEEE Journal of Solid-State Circuits, vol. 31, No. 7, Jul. 1996, pp. 1063-1066.
Anonymous, "400Mhz SLDRAM, 4M x 16 SLDRAM Pipelined, Eight Bank, 2.5 V Operation," SLDRAM Consortium Advance Sheet, published throughout the United States, Jan. 1997, pp. 1-22.
Kim, B. et al., "A 30MHz High-Speed Analog/Digital PLL in 2.mu.m CMOS", ISSCC, Feb. 1990, Two Pages.
Nielson, E., "Inverting latches make simple VCO", EDN, Jun. 19, 1997, Five Pages.
Ishibashi, A. et al., "High-Speed Clock Distribution Architecture Employing PLL for 0.6.mu.m CMOS SOG", IEEE Custom Integrated Circuits Conference, 1992, pp. 27.6.1-27.6.4.
Sidiropoulos, S. et al., "A 700-Mb/s/pin CMOS Signaling Interface Using Current Integrating Receivers", IEEE Journal of Solid-State Circuits, vol. 32, No. 5, May 1997, pp. 681-690.
Park, D. et al., "Fast Acquisition Frequency Synthesizer with the Mulitple Phase Detectors", IEEE Pacific Rim Conference on Communications, Computers and Signal Processing, vol. 2, May 1991, pp. 665-668.
Arai, Y. et al., "A Time Digitizer CMOS Gate-Array with a 250 ps Time Resolution", XP 000597207, IEEE Journal of Soild-State Circuits, vol. 31, No. 2, Feb. 1996, pp. 212-220.
Novof, I. et al., "Fully Integrated CMOS Phase-Locked Loop with 15 to 240 MHz Locking Range and +50 ps Jitter", IEEE Journal of Solid-State Circuits, vol. 30, No. 11, Nov. 1995, pp. 1259-1266.
Stefanos Sidiropoulos, "A CMOS 500 Mbs/pin synchronous point to point link interface," VLSI Circuits Digest of Technical Papers, pp. 43 and 44, 1994.
Beomsup Kim et al., "A 30Hz High-Speed Analog/Digital PLL in 2.mu.m CMOS," Digest of Technical Papers, Feb. 15, 1990.
Atsuhiko Ishibashi et al., "High-Speed Clock Distribution Architecture Employing PLL for 0.6.mu.m CMOS SOG," IEEE 1992 Custom Integrated Circuits Conference, pp. 27.6.1-27.6.4, 1992.
Thomas H. Lee et al., "A 2.5V Delay-Locked Loop for an 19Mb 500MB/s DRAM," IEEE International Solid-State Circuit Conference, pp. 300 and 301, 1994.
Satoru Tanoi et al., "A 250-622 MHz Deskew and Jitter-Suppressed Clock Buffer Using Two-Loop Architecture," IEICE Trans. Electron., vol. E79-C, pp. 898-904, Jul. 7, 1996.
Stefanos Sidiropoulos and Mark Horowitz, "A 700-Mb/s/pin CMOS Signaling Interface Using Current Integrating Receivers," IEEE Journal of Solid-State Circuits, vol. 32, Issue No. 5, pp. 681-690, May 1997.
"Draft Standard for a High-Speed Memory Interface (SyncLink)," Microprocessor and Microcomputer Standards Subcommittee of the IEEE Computer Society, Copyright 1996 by the Institute of Electrical and Electronics Engineers, Inc., New York, NY, pp. 1-56.
Arai, Y. et al., "A CMOS Four Channel .times. 1K Time Memory LSI with 1-ns/b Resolution", IEEE Journal of Solid-State Circuits, vol. 27, No. 3,M, 8107 Mar. 1992, No. 3, New York, US.
Cho, J. "Digitally-Controlled PLL with Pulse Width Detection Mechanism for Error Correction", ISSCC 1997, Paper No. SA 20.3, pp. 334-335.

METHOD AND APPARATUS FOR GENERATING A SEQUENCE OF CLOCK SIGNALS

CROSS-REFERENCE TO RELATED APPLICATIONS

This application is a continuation of U.S. application Ser. No. 11/897,837, filed Aug. 31, 2007, which application is a continuation of U.S. application Ser. No. 11/182,965, filed Jul. 15, 2005 and issued on Aug. 19, 2008 as U.S. Pat. No. 7,415,404, which application is a continuation of U.S. application Ser. No. 09/758,970, filed Jan. 9, 2001 and issued on Oct. 11, 2005 as U.S. Pat. No. 6,954,097, which application is a continuation of U.S. application Ser. No. 08/879,847, filed Jun. 20, 1997 and issued on Jan. 9, 2001 as U.S. Pat. No. 6,173,432, the disclosures of which are incorporated herein by reference. This application is related to U.S. Ser. No. 12/178,442, which was filed on Jul. 23, 2008.

TECHNICAL FIELD

This invention relates to generating a sequence of accurately phased clock signals, and more particularly, to using delay and phase locked loops to provide a sequence of clock signals that are accurately phased relative to a master clock signal.

BACKGROUND OF THE INVENTION

Clock signals are used by a wide variety of digital circuits to control the timing of various events occurring during the operation of the digital circuits. For example, clock signals are used to designate when commands and other signals used in computer systems are valid and can thus be used to control the operation of the computer system. A clock signal can then be used to latch the command or other signals so that they can be used after the command or other signals are no longer valid.

The problem of accurately controlling the timing of clock signals for high speed digital circuits is exemplified by clock signals used in high speed dynamic random access memories ("DRAMs") although the problem is, of course, also applicable to other digital circuits. Initially, DRAMs were asynchronous and thus did not operate at the speed of an external clock. However, since asynchronous DRAMs often operated significantly slower than the clock frequency of processors that interfaced with the DRAM, "wait states" were often required to halt the processor until the DRAM had completed a memory transfer. The operating speed of asynchronous DRAMs was successfully increased through such innovations as burst and page mode DRAMs which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory is coupled to the processor directly through the processor bus. Rather than requiring that separate address and control signals be provided to the system memory, SyncLink memory devices receive command packets that include both control and address information. The SyncLink memory device then outputs or receives data on a data bus that is coupled directly to the data bus portion of the processor bus.

An example of a packetized memory device using the SyncLink architecture is shown in FIG. 1. The SyncLink memory device 10 includes a clock divider and delay circuit 40 that receives a master or command clock signal on line 42 and generates a large number of other clock and timing signals to control the timing of various operations in the memory device 10. The memory device 10 also includes a command buffer 46 and an address capture circuit 48 which receive an internal clock signal ICLK, a command packet CA0-CA9 on a command bus 50, and a FLAG signal on line 52. As explained above, the command packet contains control and address data for each memory transfer, and the FLAG signal identifies the start of a command packet which may include more than one 10-bit packet word. In fact, a command packet is generally in the form of a sequence of 10-bit packet words on the 10-bit command bus 50. The command buffer 46 receives the command packet from the bus 50, and compares at least a portion of the command packet to identifying data from an ID register 56 to determine if the command packet is directed to the memory device 10 or some other memory device 10 in a computer system. If the command buffer determines that the command is directed to the memory device 10, it then provides a command word to a command decoder and sequencer 60. The command decoder and sequencer 60 generates a large number of internal control signals to control the operation of the memory device 10 during a memory transfer.

The address capture circuit 48 also receives the command words from the command bus 50 and outputs a 20-bit address corresponding to the address data in the command. The address is provided to an address sequencer 64 which generates a corresponding 3-bit bank address on bus 66, a 10-bit row address on bus 68, and a 7-bit column address on bus 70.

One of the problems of conventional DRAMs is their relatively low speed resulting from the time required to precharge and equilibrate circuitry in the DRAM array. The packetized memory device 10 shown in FIG. 1 largely avoids this problem by using a plurality of memory banks 80, in this case eight memory banks 80a-h. After a memory read from one bank 80a, the bank 80a can be precharged while the remaining banks 80b-h are being accessed. Each of the memory banks 80a-h receive a row address from a respective row latch/decoder/driver 82a-h. All of the row latch/decoder/drivers 82a-h receive the same row address from a predecoder 84 which, in turn, receives a row address from either a row address register 86 or a refresh counter 88 as determined by a multiplexer 90. However, only one of the row latch/decoder/drivers 82a-h is active at any one time as determined by bank control logic 94 as a function of bank data from a bank address register 96.

The column address on bus 70 is applied to a column latch/decoder 100 which, in turn, supplies I/O gating signals to an I/O gating circuit 102. The I/O gating circuit 102 interfaces with columns of the memory banks 80a-h through sense amplifiers 104. Data is coupled to or from the memory banks 80a-h through the sense amplifiers 104 and I/O gating circuit 102 to a data path subsystem 108 which includes a read data path 110 and a write data path 112. The read data path 110 includes a read latch 120 receiving and storing data from the I/O gating circuit 102. In the memory device 10 shown in FIG.

1, 64 bits of data are applied to and stored in the read latch 120. The read latch then provides four 16-bit data words to a multiplexer 122. The multiplexer 122 sequentially applies each of the 16-bit data words to a read FIFO buffer 124. Successive 16-bit data words are clocked through the FIFO buffer 124 by a clock signal generated from an internal clock by a programmable delay circuit 126. The FIFO buffer 124 sequentially applies the 16-bit words and two clock signals (a clock signal and a quadrature clock signal) to a driver circuit 128 which, in turn, applies the 16-bit data words to a data bus 130. The driver circuit 128 also applies the clock signals to a clock bus 132 so that a device, such as a processor, reading the data on the data bus 130 can be synchronized with the data.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80*a-h* through the I/O gating circuit 102 and the sense amplifier 104.

As mentioned above, an important goal of the SyncLink architecture is to allow data transfer between a processor and a memory device to occur at a significantly faster rate. However, the operating rate of a packetized DRAM, including the packetized memory device 10 shown in FIG. 1, is limited by the time required to receive and process command packets applied to the memory device 10. More specifically, not only must the command packets be received and stored, but they must also be decoded and used to generate a wide variety of signals. However, in order for the memory device 10 to operate at a very high speed, the command packets must be applied to the memory device 10 at a correspondingly high speed. As the operating speed of the memory device 10 increases, the command packets are provided to the memory device 10 at a rate that can exceed the rate at which the command buffer 46 can process or even store the command packets.

One of the limiting factors in the speed at which the command buffer 46 can store and process the command packets is control of the relative timing between the command packets and the clock signal ICLK. Both the command data signals and the ICLK signal are delayed relative to receipt of the command packet on the command bus 50 and the master clock signal on line 42. Furthermore, the amount of the delay is highly variable, and it is difficult to control. If the delay of the internal clock signal ICLK cannot be precisely controlled, it may cause the latch in the command buffer 48 to latch invalid command data signals. Thus, the speed at which command packets can be applied to the memory device 10 is limited by the delays in the memory device 10. Similar problems exist for other control signals in the memory device 10 which control the operation of the memory device 10 during each clock cycle.

Although the foregoing discussion is directed to the need for faster command buffers in packetized DRAMs, similar problems exist in other memory devices, such as asynchronous DRAMs and synchronous DRAMs, which must process control and other signals at a high rate of speed. Thus, for the reasons explained above, the limited operating speed of conventional command buffers threatens to severely limit the maximum operating speed of memory devices, particularly packetized DRAMs. Therefore, there is a need to precisely control the timing of clock signals relative to other signals, such as command packets applied to a command buffer in a packetized DRAM.

SUMMARY OF THE INVENTION

A clock generator circuit is used to provide a sequence of clock signals that have predetermined phases relative to a master clock signal. The clock generator circuit includes a first locked loop generating the sequence of clock signals which are increasingly delayed from a first clock signal to a last clock signal. Two of the clock signals, preferably the first and last clock signals, are locked to each other, such as by using a delay-locked loop, so that they have a predetermined phase with respect to each other. A second lock loop, which may also be a delay-locked loop, locks one of the clock signals in the sequence to the master clock signal so that the clock signals have respective phases with respect to the master clock signal. Where delay-locked loops are used, the first delay lock loop delay may lock the first clock signal and the last clock signal so that they are the inverse of each other. As a result, the first and last clock signals have respective phases that are 180 degrees from each other. Similarly, the second delay-lock loop may delay lock the first clock signals to the master clock signal so that they have substantially the same phase. The first delay-locked loop preferably includes a first voltage controlled delay circuit and a first phase detector. The first voltage controlled delay circuit generates the sequence of clock signals from the reference clock signal by delaying the reference clock signal by respective delays that are a function of a first control signal. A first phase detector compares the phase of the first and last clock signals and generates the first control signal as a function of the difference therebetween. Likewise, the second delay-locked loop preferably includes a second voltage controlled delay circuit and a second phase detector. The second voltage controlled delay circuit receives the master clock signal and generates a reference clock signal having a delay relative to the master clock signal that is a function of a second control signal. The second phase detector compares the phase of the master clock signal to the phase of the first clock signal and generating the second control signal as a function of the difference therebetween. A multiplexer may be coupled to the first delay-lock loop to couple one of the clock signals to a clock output terminal for use, for example, to latch command data in packetized DRAM.

DETAILED DESCRIPTION OF THE INVENTION

Figure 2:
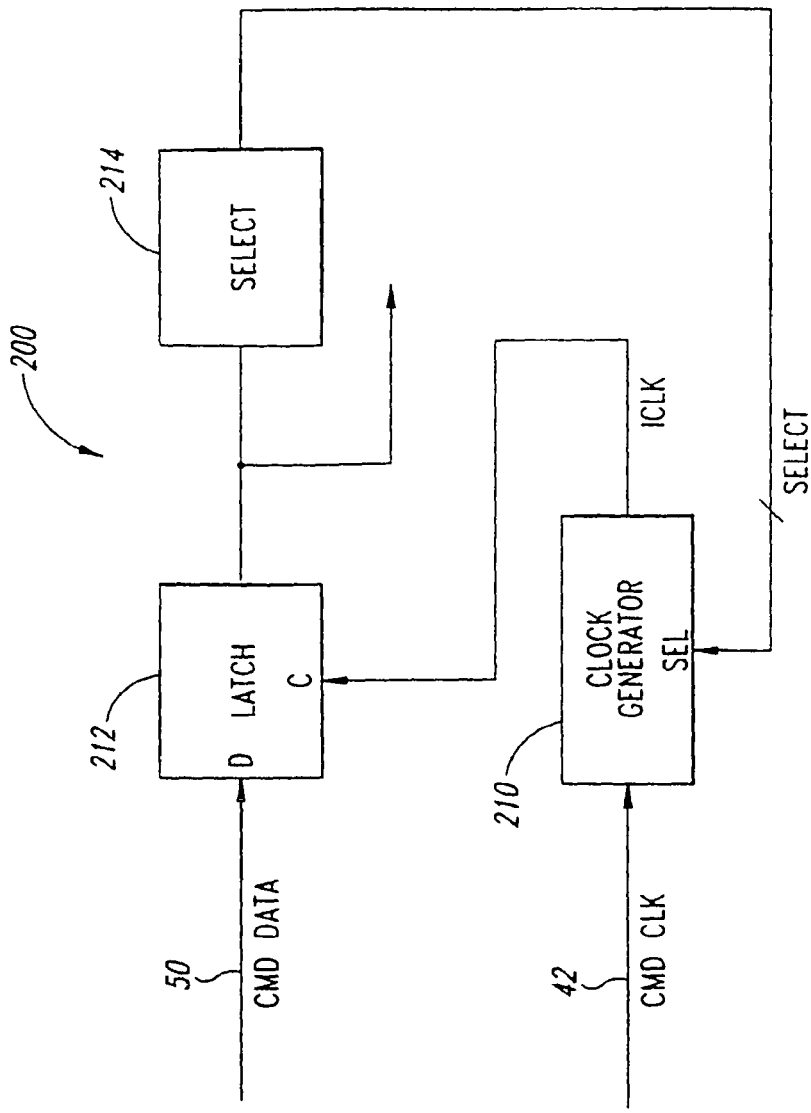
FIG. 2 is a block diagram illustrating the manner in which an embodiment of clock generator in accordance with present invention may be used in a command latch in the packetized DRAM of FIG. 1.

One embodiment of a command latch 200 using an embodiment of a clock generator 210 in accordance with present invention is illustrated in FIG. 2. The command latch 200 also includes a latch circuit 212 receiving a command data bit CMD DATA from a command packet on a line of the command bus 50. The clock generator 210 receives a master or command clock signal CMD CLK on line 42 and generates the internal clock signal ICLK which is applied to the clock input of the latch circuit 212. The output of the latch circuit 212 is coupled to a variety of circuits in the memory device 10, including a select circuit 214. As explained below, the clock generator 210 produces a sequence of clock signals each having an increased delay relative to the leading edge of the master clock. One of the clock signals in the sequence is selected for use as the internal clock signal ICLK for clocking the latch circuit 212. The clock signal in the sequence for use as ICLK is selected by a multi-bit select word SELECT generated by the select circuit 214. Basically, the select circuit 214 determines which of the clock signals in the sequence has the proper timing to match the delay of the command data from the command bus 50 to the input of the latch circuit 212. The select circuit 214 then applies an appropriate SELECT word to the clock generator 210 to use the selected clock signal in the sequence as the internal clock signal ICLK.

A variety of designs may be used for the select circuit 214, as will be apparent to one skilled in the art. For example, a plurality of very short logic "1" pulses may be applied to the command bus line 50 in synchronism with the command clock signal CMD CLK. The select circuit 214 can then select each of the clock signals in the sequence and determine which clock signal(s) are able to capture the logic "1" pulses. If several clock signals are successful in capturing the logic "1" pulses, then the clock signal occurring midway between the successful clock signals can be used as the internal clock signal ICLK.

Figure 3:
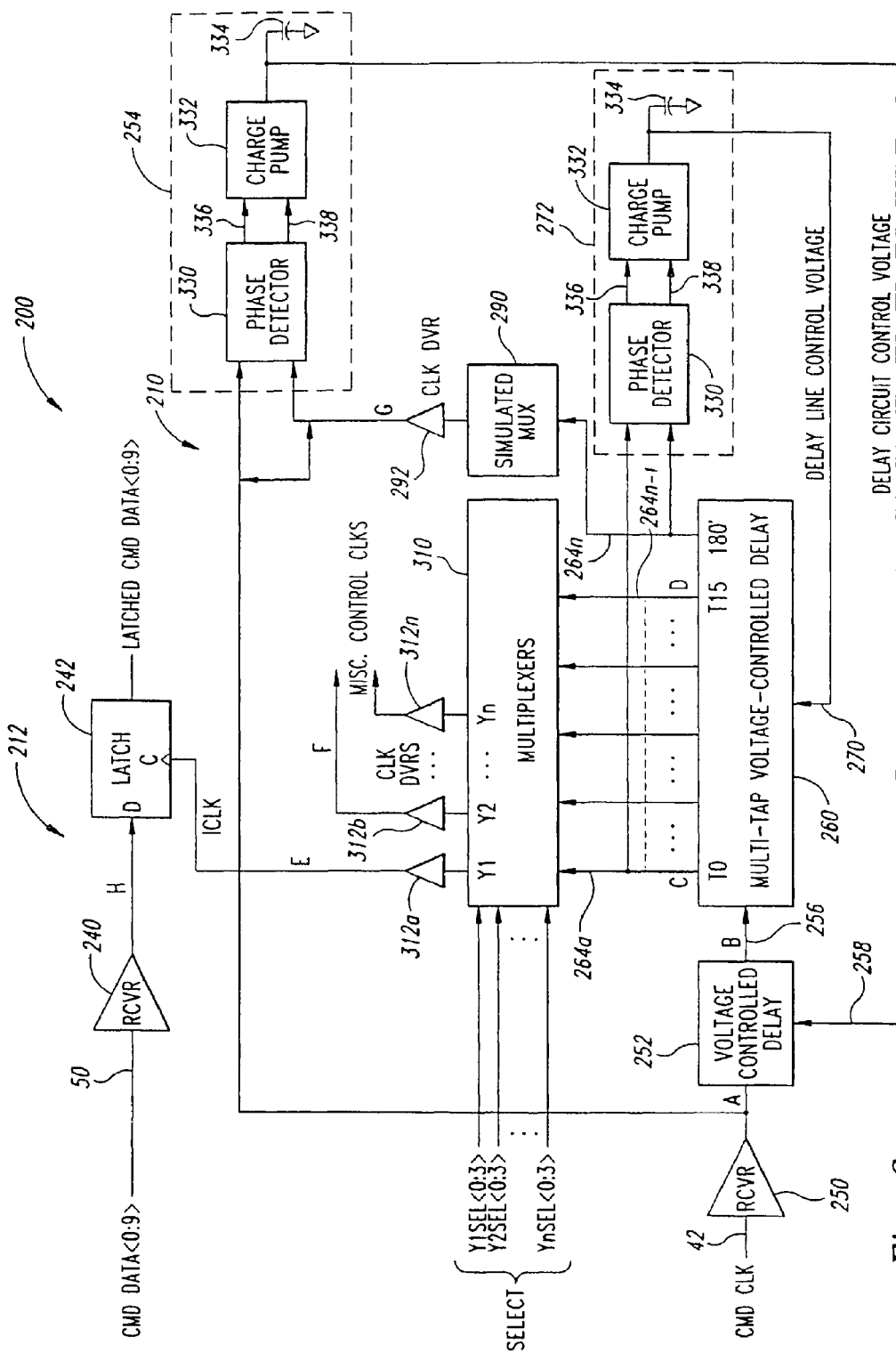
FIG. 3 is a more detailed block diagram and logic diagram of the command latch of FIG. 2 using an embodiment of a clock generator in accordance with present invention.

The command latch 200, including one embodiment of a clock generator 210 in accordance with the present invention, is shown in greater detail in FIG. 3. The latch 212 is illustrated in FIG. 3 as consisting of a receiver buffer 240 receiving a respective one of 10 bits of the command data CMD DATA. The output of the receiver buffer 240 is applied to the data input D of a latch circuit 242. The latch circuit 242 latches or stores the logic level applied to its D input whenever a clock signal applied to its clock C input goes high. The stored logic level is then continuously applied to the output of the latch circuit 242. Although a single receiver buffer 240 and latch circuit 242 are shown in FIG. 3, it will be understood that there are actually 10 receiver buffers 240 and latch circuits 242 to store the 10 bits of the command data on the command bus 50.

As explained above, it is very difficult to clock the latch circuit 242 at the proper time at the maximum speed of the command latch 200 because delays of the CMD DATA from the command bus 50 to the latch circuit 242 may not be equal to delays of the CMD CLK from the line 42 to the clock input of the latch circuit 242. Also, of course, unequal delays external to an integrated circuit containing the command latch 200 may cause the CMD CLK and the CMD DATA to be applied to the integrated circuit at different times. The function of the clock generator 210 is to provide an internal clock signal ICLK to the clock input of the latch circuit 242 that is capable of storing a command data bit at even the fastest operating speed of the command latch 200 despite any unequal internal or external delays that would cause the command bit and ICLK to be coupled to the latch circuit 242 at different times. However, it will be understood that the clock generator 210 may be used for other purposes both in dynamic random access memories and in other circuits.

The master or command clock CMD CLK is coupled from line 42 through a receiver buffer 250 substantially identical to the receiver buffer 240 coupling a command data bit to the latch circuit 242. The output of the receiver buffer 250 is applied to a conventional voltage controlled delay circuit 252 and to one input of a phase detector 254. The voltage controlled delay circuit 252 couples the output of the receiver buffer 250 to an output line 256 with a delay that is a function of a control signal applied to the delay circuit 252 on line 258. Although the control signal on line 258 is an analog voltage, it will be understood that other types of control signals, including digital words, may alternatively be used. The output of the voltage controlled delay circuit 252 is applied to a multi-tap voltage controlled delay line 260.

The multi-tap voltage controlled delay line 260 couples the clock signal applied to its input on line 256 to a plurality of output lines 264a-264n. The incoming clock signal is coupled to the output lines 264 with an increasing delay from the first line 264a to the last line 264n. In the embodiment illustrated in FIG. 3, there are 17 output lines 264, but the delay line 260 may have a greater or lesser number of output lines 264. When a delay locked loop that includes the delay line 260 is locked as explained below, the signals at the first output line 264a and the last or 17th output line 264n are the inverse of each other, i.e., phased 180 degrees from each other. Thus, the signals on the 17 lines are delayed by 11.25 degrees more than the signal coupled to the previous line 264. Thus, the first line 264a has a relative phase of zero degrees, the 16th line 264n−1 has a phase of 168.75 degrees and the last line 264n has a phase of 180 degrees. More specifically, a control voltage applied to the delay line 260 through line 270 is adjusted so that the phase of the signal on the last line 264n relative to the phase on the first line 264a is 180 degrees. This is accomplished by applying the first line 264a and the last line 264n to respective inputs of a phase detector 272.

As mentioned above, the delay line 260 and phase detector 272 implement a first delay locked loop. When the first delay locked loop is locked, the signal on line 264n will have a phase relative to the phase of the signal on line 264a of 180 degrees. Therefore, as mentioned above, the signal on each of the output lines 264a-264n will sequentially increase from zero degrees to 180 degrees. Although the signals on lines 264a-n are equally phased apart from each other, it will be understood that equal phasing is not required.

The clock generator 210 also includes a second delay locked loop formed by the phase detector 254, the voltage controlled delay circuit 252 and the voltage controlled delay line 260. More particularly, the last output line 264n of the delay line 260 is applied through a simulated multiplexer circuit 290 and a clock driver 292 to one input of the phase detector 254. It will be recalled that the other input of the phase detector 254 receives the output of the receiver buffer 250. Like the phase detector 272, when the second delay locked loop is locked, the signals applied to the phase detector 254 are the inverse of each other. Thus, when the second loop is locked, the phase of the signal at the output of the clock driver 292 is 540 degrees (effectively 180 degrees) relative to the phase of the signal at the output of the receiver buffer 250.

The remaining output lines 264a-264n−1 of the delay line 260 are coupled to a multiplexer 310 having a plurality of output lines coupled to respective clock drivers 312a-n. The multiplexer 310 couples the input of each of the clock drivers 312a-n to any one of the output lines 264a-264n−1 as determined by respective select words SELECT. The clock driver 312a is used to generate the internal clock signal ICLK which is coupled to the clock input of the latch circuit 242. The other clock drivers 312b-n are used to couple various clock outputs from the delay line to other circuits in the memory device (not shown).

The phase detectors 254, 272 are each implemented using to a phase detector circuit 330, a charge pump 332 and a capacitor 334. However, other varieties of phase detectors may alternatively be used.

The phase detector circuit 330 applies either an increase signal on line 336 or a decrease signal on line 338 to respective inputs of the charge pump 332. The phase detector circuit 330 generates the increase signal on line 336 whenever the phase of a first signal on one of its inputs relative to a second signal on the other of its inputs is less than 180 degrees. As explained below, the increase signal on line 336 causes the charge pump 332 to adjust the control voltage to increase the delay of the first signal so that the phase of the first signal relative to the phase of the second signal approaches 180 degrees. The phase detector circuit 330 generates the decrease signal on line 338, in the opposite condition, i.e., when the phase of the second signal relative to the first signal is greater than 180 degrees. The decrease signal on line 338 causes the charge pump 332 to adjust the control voltage to reduce the delay of second signal toward 180 degrees.

Although the phase detector circuit 330 may be implemented in a variety of ways, it may simply use two set-reset flip-flops (not shown) for generating the increase and decrease signals, respectively. The increase flip-flop is set by the rising edge of the first signal on one of the inputs and reset by the falling edge of the second signal on the other input. Thus, the duration that the flip-flop is set, and hence the duration of the increase signal on line 336, corresponds to the period of time that the second signal must be further delayed to have a phase of 180 degrees relative to the phase of the first signal. Similarly, the flip-flop producing the decrease signal on line 338 is set by the falling edge of the second signal and reset by the rising edge of the first signal so that the duration of the decrease signal on line 338 corresponds to the time that the second signal is delayed beyond the time that it would have a phase of 180 degrees relative to the phase of the first signal.

Figure 4:
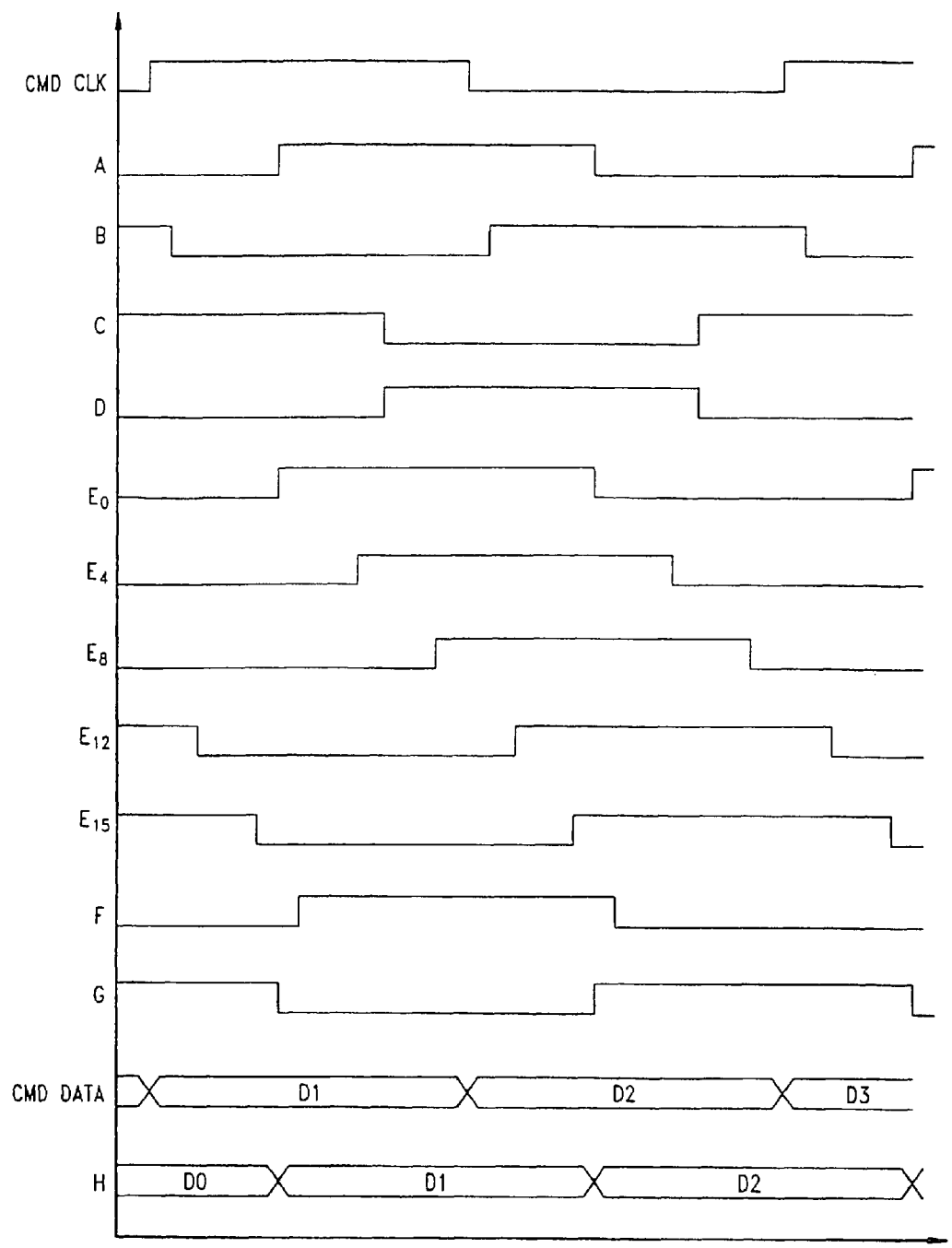
FIG. 4 is a timing diagram showing many of the waveforms present in the command latch of FIG. 3.

There are also a variety of approaches for implementing the charge pump 332. However, the charge pump 332 can be implemented by simply applying a constant current to the capacitor 334 for the duration of each increase signal on line 336 and removing a constant current from the capacitor 334 for the duration of each decrease signal on line 338. Appropriate circuitry could also be included in either the phase detector circuit 330 or the charge pump 332 to provide hysteresis in a band when the first and second signals have relative phases of approximately 180 degrees from each other as will be apparent to one skilled in the art. The operation of the command latch 200 of FIG. 3 can best be explained with reference to the timing diagram of FIG. 4. As illustrated in FIG. 4, the command clock signal CMD CLK on line 42 is delayed by approximately 70 degrees in passing through the receiver buffer 250 to node A (FIG. 3). Assuming that both of the delay-lock loops are locked, the signal at the output of the receiver buffer 250 is delayed by 120 degrees in passing through the voltage controlled delay circuit 252 to node B. The signal on node B is then coupled to node C with a delay of another 120 degrees and to node D with a delay of 300 degrees so that the signals at nodes C and D are phased 180 degrees apart from each other. Since the signals at nodes C and D are compared to each other by the phase detector 272, the phase detector 272 adjusts the control voltage on line 270 to ensure that the signals at nodes C and D are phased 180 degrees from each other. The other outputs from the delay line 260 have phases relative to the phase of the signal at node C that increase 11.25 degrees for each output in sequence from the first line 264a to the last line 264n.

As mentioned above, one of the first 16 output lines 264a-264n−1 of the delay lines 260 is coupled through the multiplexer 310 and the clock driver 312a to provide the internal clock signal ICLK at node E. In passing through the multiplexer 310 and the clock driver 312a, the selected output from the delay line is delayed by another 120 degrees. Thus, the signal Eo coupled from the first output line of the delay line 260 is delayed by 120 degrees, the signal E4 from the fifth output is delayed by 165 degrees, the signal E8 from the ninth output is delayed by 210 degrees, the signal E12 from the 13th output is delayed by 255 degrees, and the signal E15 from the 16th output is delayed by 288.75 degrees. Although the output signals are coupled from the delay line 260 through the multiplexer 310 and clock driver 312a with a delay, that delay is matched by the coupling of the signal from line 264n through the simulated multiplexer 290 and clock driver 292 since the same circuit is used for the simulated multiplexer 290 as the multiplexer 310 and the clock driver 292 is identical to the clock driver 312a. For this reason, and because the phase of the signal on line 264n is 180 degrees relative to the phase of the signal on line 264a, the signal at the output of the clock driver 292 at node G has a phase relative to the phase of the signal Eo at the output of the clock 31'a of 180 degrees. Since the signals applied to the inputs of the phase detector 254 are the inverse of each other when the delay-locked loop is locked, the signal Eo has substantially the same phase as the signal at the output of the receiver buffer 250. Furthermore, the delay of the voltage controlled delay circuit 252 will be adjusted so that the signal Eo always has the same phase as the command clock coupled to the output of the receiver buffer 250 at A. Assuming the CMD DATA is valid on the rising edge of the CMD CLK signal, the command data bit coupled to the latch circuit 242 is valid on the rising edge of ICLK since ICLK is properly phased to the signal at node A and the delay through the receiver buffer 250 is substantially the same as the delay through the receiver buffer 240.

In operation, the multiplexer 310 selects one of the outputs from the delay line 260 as determined by the SELECT signal so that the optimum clock signal between Eo and E15 (FIG. 4) will be used as the internal clock ICLK.

In summary, the "inner" delay locked loop formed by the phase detector 272 and the voltage controlled delay circuit 260 generates a sequence of signals that have increasing phases from zero to 180 degrees. The "outer" delay locked loop formed by the phase detector 254, the voltage controlled delay circuit 252 and the delay line 260 align one of the clock signals in the sequence to the command clock. As a result, all of the clock signals at the output of the delay line 260 have respective predetermined phases relative to the phase of the command clock at node A.

Although the embodiment of the clock generator 210 illustrated in FIG. 3 uses delay-locked loops, it will be understood that other locked loop circuits, such as phase-locked loop circuits, may also be used. Other modifications will also be apparent to one skilled in the art.

Figure 1:
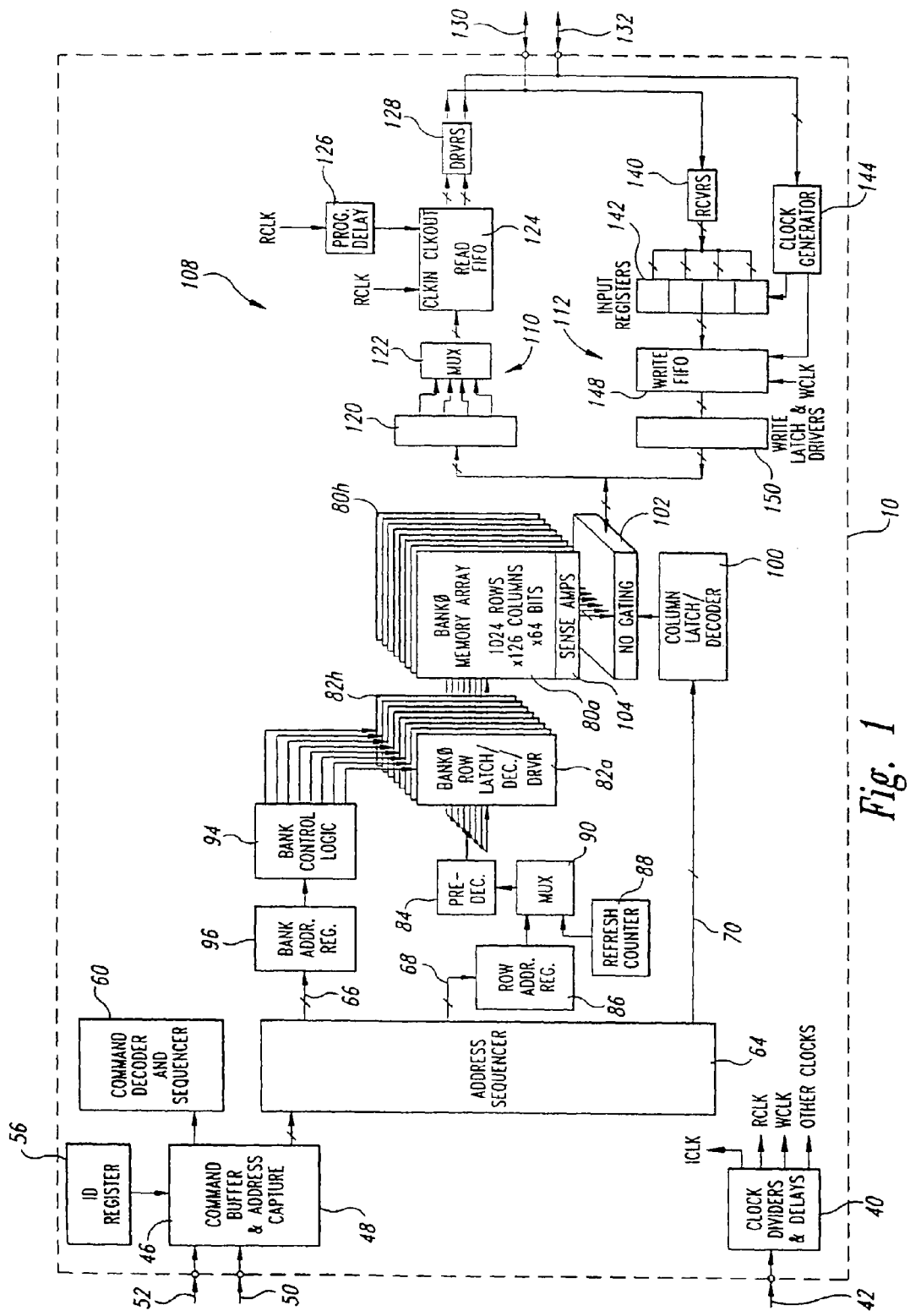
FIG. 1 is a block diagram of a conventional packetized dynamic random access memory ("DRAM") that may use a clock generator in accordance with an embodiment of the present invention.
Figure 5:
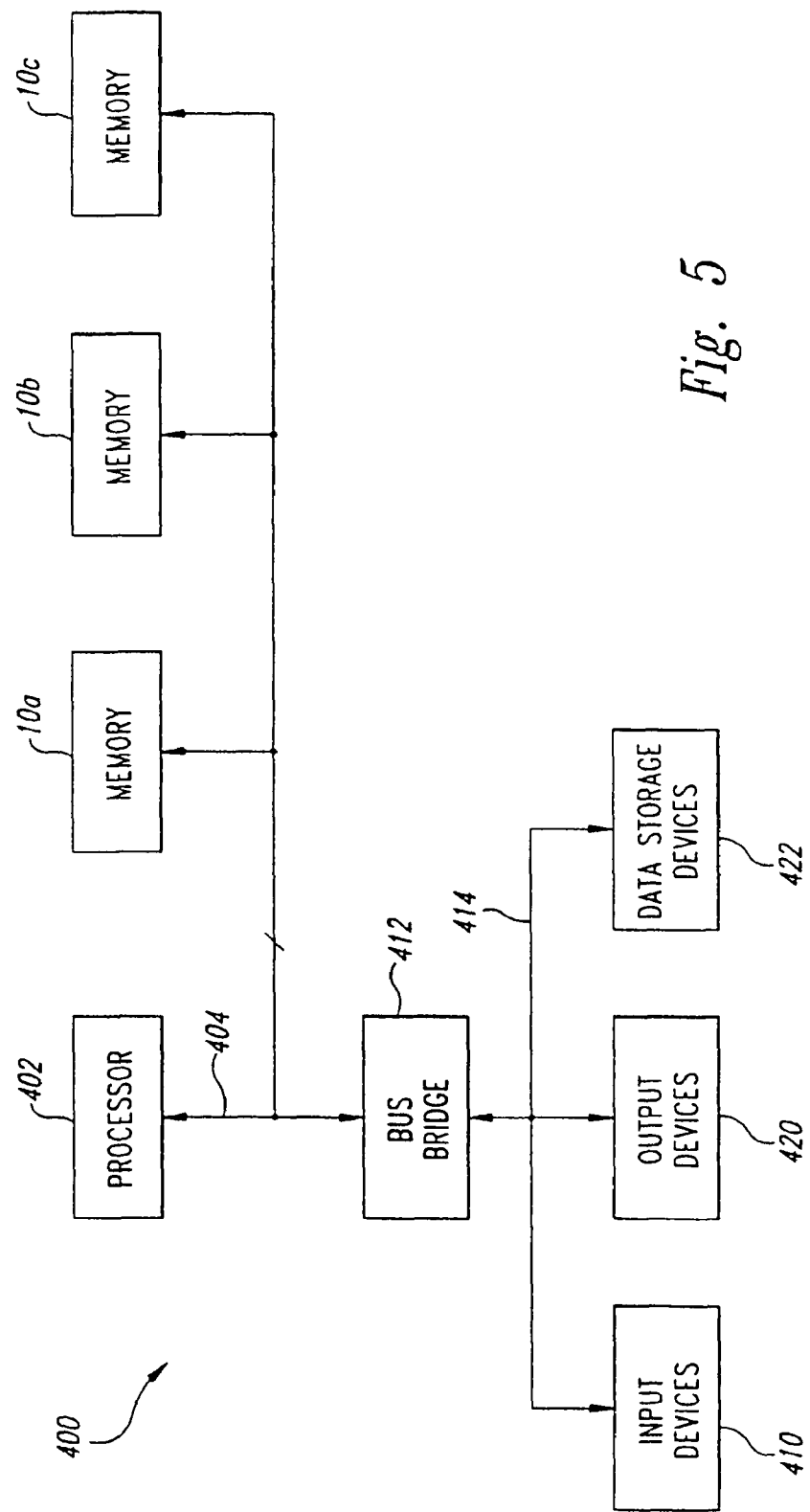
FIG. 5 is a block diagram of a computer system using a plurality of DRAMs, each of which include the command latch of FIG. 3.

A computer system using the command latch 200 of FIGS. 2 and 3 in each of a plurality of packetized DRAMs 10 of FIG. 1 is shown in FIG. 5. With reference to FIG. 5 the computer system 400 includes a processor 402 having a processor bus 404 coupled to three packetized dynamic random access memory or SyncLink DRAMs ("SLDRAM") 10a-c. The computer system 400 also includes one or more input devices 4100, such as a keypad or a mouse, coupled to the processor 402 through a bus bridge 412 and an expansion bus 414, such as an industry standard architecture ("ISA") bus or a Peripheral component interconnect ("PCI") bus. The input devices 410 allow an operator or an electronic device to input data to the computer system 400. One or more output devices 420 are coupled to the processor 402 to display or otherwise output data generated by the processor 402. The output devices 420 are coupled to the processor 402 through the expansion bus 414, bus bridge 412 and processor bus 404. Examples of output devices 420 include printers and video display units. One or more data storage devices 422 are coupled to the processor 402 through the processor bus 404, bus bridge 412, and expansion bus 414 to store data in or retrieve data from storage media (not shown). Examples of storage devices 422 and storage media include fixed disk drives floppy disk drives, tape cassettes and compact-disk read-only memory drives.

In operation, the processor 402 communicates with the memory devices 10a-c via the processor bus 404 by sending the memory devices 10a-c command packets that contain both control and address information. Data is coupled between the processor 402 and the memory devices 10a-c, through a data bus portion of the processor bus 404. Although all the memory devices 10a-c are coupled to the same conductors of the processor bus 404, only one memory device 10a-c at a time reads or writes data, thus avoiding bus contention on the processor bus 404. Bus contention is avoided by each of the memory devices 10a-c and the bus bridge 412 having a unique identifier, and the command packet contains an identifying code that selects only one of these components.

The computer system 400 also includes a number of other components and signal lines which have been omitted from FIG. 5 in the interests of brevity. For example, as explained above, the memory devices 10a-c also receive a command or master clock signal to provide internal timing signals, a data clock signal clocking data into and out of the memory device 16, and a FLAG signal signifying the start of a command packet.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A computer system, comprising:
a processor having a processor bus;
an input device coupled to the processor through the processor bus adapted to allow data to be entered into the computer system;
an output device coupled to the processor through the processor bus adapted to allow data to be output from the computer system; and
a memory coupled to the processor bus adapted to allow data to be stored, the dynamic random access memory comprising:
at least one array of memory cells adapted to store data at a location determined by a row address and a column address responsive to a command word;
a row address circuit adapted to receive and decode the row address, and select a row of memory cells corresponding to the row address responsive to the command word;
a column address circuit adapted to receive or apply data to one of the memory cells in the selected row corresponding to the column address responsive to the command word;
a data path circuit adapted to couple data between an external terminal and the column address circuit responsive to the command word; and
a command data latch circuit for storing a command data packet at a time determined from a command clock signal, the command data latch comprising:
a latch circuit configured to receive the command data and receive a selected internal clock signal appropriate to latch the command data, the latch circuit operable to latch the command data in accordance with the selected internal clock signal;
a clock generator configured to receive a master clock signal based on the command clock signal, the clock generator operable to generate a plurality of internal clock signals, including the selected internal clock signal and a reference clock signal, each internal clock signal having a different phase relative to the command clock signal and the reference clock signal having a phase relative to the command clock signal, the clock generator further configured to receive a select signal, the clock generator operable to couple the selected internal clock signal to the latch circuit responsive to the select signal;
a select circuit coupled to the latch circuit and the clock generator, the select circuit operable to identify the selected internal clock signal from the plurality of internal clock signals and generate the select signal for the clock generator;
a first locked loop operable to lock the phase between a first one of the plurality of internal clock signals and the reference clock signal; and
a second locked loop operable to lock the phase between the master clock signal and the reference clock signal.

2. The computer system of claim 1 wherein at least one of the first and second locked loops comprises a phase-locked loop.

3. The computer system of claim 1 wherein at least one of the first and second locked loops comprises a delay-locked loop.

4. The computer system of claim 1 wherein the second locked loop comprises:
a first signal generator configured to receive the master clock signal and a first control signal and operable to generate an intermediate clock signal having a predetermined phase relative to the master clock signal based on the first control signal;
a second signal generator configured to receive the reference clock signal and a second control signal and operable to generate the plurality of internal clock signals and the reference clock signal; and
wherein the second locked loop is operable to generate the first control signal based on a comparison of the master clock signal and the reference clock signals and the first locked loop is operable to generate the second control signal based on a comparison of the first of the plurality of internal clock signals and the reference clock signal.

5. The computer system of claim 4 wherein the second locked loop further comprises:
a first phase detector operable to compare the phase between the master clock signal and the reference clock signals; and
a first charge pump coupled to the first phase detector, the first charge pump operable to provide the first control signal to the first signal generator.

6. The computer system of claim 5 wherein the first locked loop comprises the second signal generator, a second phase detector operable to compare the phase between the first of the internal clock signals and the reference clock signal; and a second charge pump coupled to the second phase detector, the second charge pump operable to provide the second control signal to the second signal generator.

7. The computer system of claim 4 wherein the charge pump further comprises:
a multiplexer coupled to the second signal generator, the multiplexer operable to receive the selected internal clock signal responsive to the select signal; and
a clock driver coupled to the multiplexer and the latch, the clock driver configured to receive the selected internal clock signal from the multiplexer and operable to couple the selected internal clock signal to the latch, wherein the multiplexer and the clock driver delay the selected internal clock signal by a predetermined internal delay amount.

8. The computer system of claim 4 wherein the command latch further comprises:
a simulated multiplexer coupled to the second signal generator and configured to receive the reference clock signal; and
a second clock driver coupled to the simulated multiplexer and the second locked loop, the second clock driver configured to receive one of the plurality of internal clock signals from the simulated multiplexer and operable to couple the one of the plurality of internal clock signals to the second locked loop, wherein the simulated multiplexer and the second clock driver delay the one of the plurality of internal clock signals the predetermined internal delay amount.

9. The computer system of claim 1 wherein the second locked loop comprises:
a first signal generator operable to produce the reference clock signal at an output terminal, the reference clock signal having a phase relative to the master clock signal that is a function of a first control signal applied to a first control terminal; and
a first phase detector having a first input terminal coupled to the master clock signal, a second input terminal coupled to the reference clock signal, and an output terminal coupled to the first control terminal of the first signal generator, the first phase detector operable to generate the control signal as a function of the difference in phase between the master clock signal and the reference clock signal at the first and second input terminals, respectively; and
wherein the first locked loop comprises:
a second signal generator coupled to the reference clock signal from the first signal generator and operable to produce the plurality of internal clock signals, the phase of the internal clock signals relative to the reference clock signal being a function of a second control signal applied to a second control terminal; and
a second phase detector having a first input terminal coupled to the reference clock signal from the first signal generator, a second input terminal coupled to one of the plurality of clock signals, and an output terminal coupled to the second control terminal of the second signal generator, the second phase detector operable to generate the control signal as a function of the difference in phase between the reference clock signal and the clock signal applied to the first and second input terminals, respectively.

10. A computer system, comprising:
a processor having a processor bus;
an input device coupled to the processor through the processor bus adapted to allow data to be entered into the computer system;
an output device coupled to the processor through the processor bus adapted to allow data to be output from the computer system; and
a memory coupled to the processor bus adapted to allow data to be stored, the dynamic random access memory comprising:
at least one array of memory cells adapted to store data at a location determined by a row address and a column address responsive to a command word;
a row address circuit adapted to receive and decode the row address, and select a row of memory cells corresponding to the row address responsive to the command word;
a column address circuit adapted to receive or apply data to one of the memory cells in the selected row corresponding to the column address responsive to the command word;
a data path circuit adapted to couple data between an external terminal and the column address circuit responsive to the command word; and
a command data latch circuit for storing a command data packet at a time determined from a command clock signal, the command data latch comprising:
a latch circuit having a data input and a clock input, the data input adapted to receive the command data packet and the latch circuit operable to store the command data packet responsive to a clock signal applied to the clock input;
a clock generator circuit operable to generate a sequence of clock signals from a periodic master clock signal, the sequence of clock signals increasingly delayed from a first clock signal to a last clock signal, the sequence of clock signals including the clock signal applied to the clock input of the latch circuit,
a select circuit operable to determine which of the signals in the sequence of clock signals from the clock generator should be used to cause the latch circuit to store the command data packet and generate the select signal corresponding thereto;
a first locked loop operable to generate the sequence of clock signals and lock two of the clock signals in the sequence such that they have a predetermined phase with respect to each other; and
a second locked loop operable to lock one of the clock signals in the sequence of clock signals to the master clock signal so that the clock signals in the sequence have respective phases with respect to the master clock signal.

11. The computer system of claim 10, wherein at least one of the first and second locked loops comprises a phase locked loop.

12. The computer system of claim 10, wherein at least one of the first and second locked loops comprises a delay locked loop.

13. The computer system of claim 10, further comprising:
a first multiplexer coupled to the first locked loop, the first multiplexer operable to couple the selected clock signal to the clock input of the latch circuit, the multiplexer delaying the selected clock signal by a predetermined delay amount; and
a second multiplexer coupled to the second locked loop, the second multiplexer operable to couple the one of the clock signals to the second locked loop such that the one of the clock signals is delayed by the predetermined delay amount.

14. A computer system, comprising:
a processor having a processor bus;
an input device coupled to the processor through the processor bus adapted to allow data to be entered into the computer system;
an output device coupled to the processor through the processor bus adapted to allow data to be output from the computer system; and
a memory coupled to the processor bus adapted to allow data to be stored, the dynamic random access memory comprising:
at least one array of memory cells adapted to store data at a location determined by a row address and a column address responsive to a command word;
a row address circuit adapted to receive and decode the row address, and select a row of memory cells corresponding to the row address responsive to the command word;
a column address circuit adapted to receive or apply data to one of the memory cells in the selected row corresponding to the column address responsive to the command word;
a data path circuit adapted to couple data between an external terminal and the column address circuit responsive to the command word; and
a command data latch circuit for storing a command data packet at a time determined from a command clock signal, the command data latch comprising:
a clock generator configured to receive the command clock, the clock generator operable to generate a plurality of internal clock signals such that each of the plurality of internal clock signals has a predetermined phase relative to the phase of the command clock;
a latch circuit configured to receive the command data and a selected clock signal of the sequence of internal clock signals, the latch circuit operable to latch the command data using the selected clock signal;
a select circuit coupled to the clock generator and the latch circuit, the select circuit operable to determine the selected clock signal of the sequence of clock signals that will properly latch the command data;
an inner locked loop operable to generate a sequence of signals having increasing predetermined phases relative to one another; and
an outer locked loop operable to align one of the sequence of signals to the command clock signal, thereby generating the sequence of internal clock signals such that each of the internal clock signals has a different predetermined phase relative to the command clock signal.

15. The computer system of claim 14, wherein at least one of the inner and outer locked loops comprises a phase locked loop.

16. The computer system of claim 14, wherein at least one of the inner and outer locked loops comprises a delay locked loop.

17. The computer system of claim 14, further comprising:
a first multiplexer coupled to the signal generator and the latch circuit, the first multiplexer operable to receive the selected clock signal and couple the selected clock signal to the latch circuit, thereby delaying the selected clock signal by a predetermined delay amount; and
a second multiplexer coupled to the inner locked loop and the outer locked loop, the second multiplexer operable to couple at least one of the sequence of signals from the inner locked loop to the outer locked loop, the simulated multiplexer delaying the at least one signal by the predetermined delay amount.

18. The computer system of claim 14, wherein the one of the sequence of signals is coupled from the inner locked loop to the outer locked loop.

19. The computer system of claim 18 further comprising a simulated multiplexer operable to couple the one of the sequence of signals from the inner locked loop to the outer locked loop such that the one of the sequence is delayed a predetermined amount determined by the delay associated with the latch circuit receiving the selected clock signal.

20. The computer system of claim 19 further comprising a multiplexer operable to couple the selected clock signal to the latch circuit with a multiplexer delay, the simulated multiplexer configured to impose the multiplexer delay on the one of the sequence of signals.

21. The computer system of claim 20 further comprising a first clock driver operable to couple the selected clock signal from the multiplexer to the latch circuit and a second clock driver operable to couple the one of the sequence of signals from the simulated multiplexer to the outer locked loop, the first and second clock drivers configured to impose the same delay on the selected clock signal and one of the sequence of signals, respectively.

22. The computer system of claim 14, wherein the select circuit is operable to select each of the sequence of clock signals in sequence and determine which clock signal properly latches the command data.

* * * * *